United States Patent [19]
Morgan

[11] Patent Number: 5,670,920
[45] Date of Patent: *Sep. 23, 1997

[54] MULTI-TRACK SAW FILTER WITH REFLECTORS AND REVERSED POLARITY IDT CONNECTIONS

[75] Inventor: David P. Morgan, Northampton, England

[73] Assignee: Advanced SAW Products SA, Bevaix, Switzerland

[*] Notice: The term of this patent shall not extend beyond the expiration date of Pat. No. 5,663,696.

[21] Appl. No.: 426,885

[22] Filed: Apr. 24, 1995

[30] Foreign Application Priority Data

Apr. 25, 1994 [GB] United Kingdom ............... 9408181

[51] Int. Cl.⁶ ........................................... H03H 9/64
[52] U.S. Cl. ........................... 333/195; 310/313 D
[58] Field of Search .................................. 333/193, 194, 333/195, 196; 310/313 R, 313 B, 313 C, 313 D

[56] References Cited

U.S. PATENT DOCUMENTS

| | | | |
|---|---|---|---|
| 4,609,891 | 9/1986 | Solie et al. | 333/194 X |
| 5,304,965 | 4/1994 | Männer | 333/193 X |

FOREIGN PATENT DOCUMENTS

| | | | |
|---|---|---|---|
| 5110378 | 4/1993 | Japan | 333/193 |
| 1 554 366 | 10/1979 | United Kingdom . | |
| 2 117 992 | 10/1983 | United Kingdom . | |
| WO 93/08641 | 4/1993 | WIPO . | |
| WO 93/13595 | 7/1993 | WIPO . | |

OTHER PUBLICATIONS

Haydl et al., "Design and Performance of SAW-Resonators and Resonator-Filters", Agard Conference Proceedings, No. 230, Ottawa, Canada, pp. 3.3-1 to 3.3-7. Oct. 1977.

*Primary Examiner*—Benny Lee
*Assistant Examiner*—Justin P. Bettendorf
*Attorney, Agent, or Firm*—Perman & Green, LLP

[57] ABSTRACT

A SAW filter comprising at least one group of N tracks, where N is an integer greater than 2, and including at least one input interdigitated transducer (IDT) spaced apart from at least one output IDT and a reflector disposed substantially collinear with and adjacent the input and output IDTs. The respective tracks are adapted to have different effective electro-acoustic lengths such that SAWs launched from respective input IDTs undergo at least one reflection at corresponding output IDTs and at least one reflection from the respective input IDTs prior to generating coherent signals from respective output IDTs. The different effective electro-acoustic lengths may be substantially provided by there being different physical separation between input and output IDTs of respective tracks, or by IDTs of respective tracks having different polarity connections of electrodes or different amounts of material disposed in respective tracks between the input and output IDTs.

20 Claims, 11 Drawing Sheets

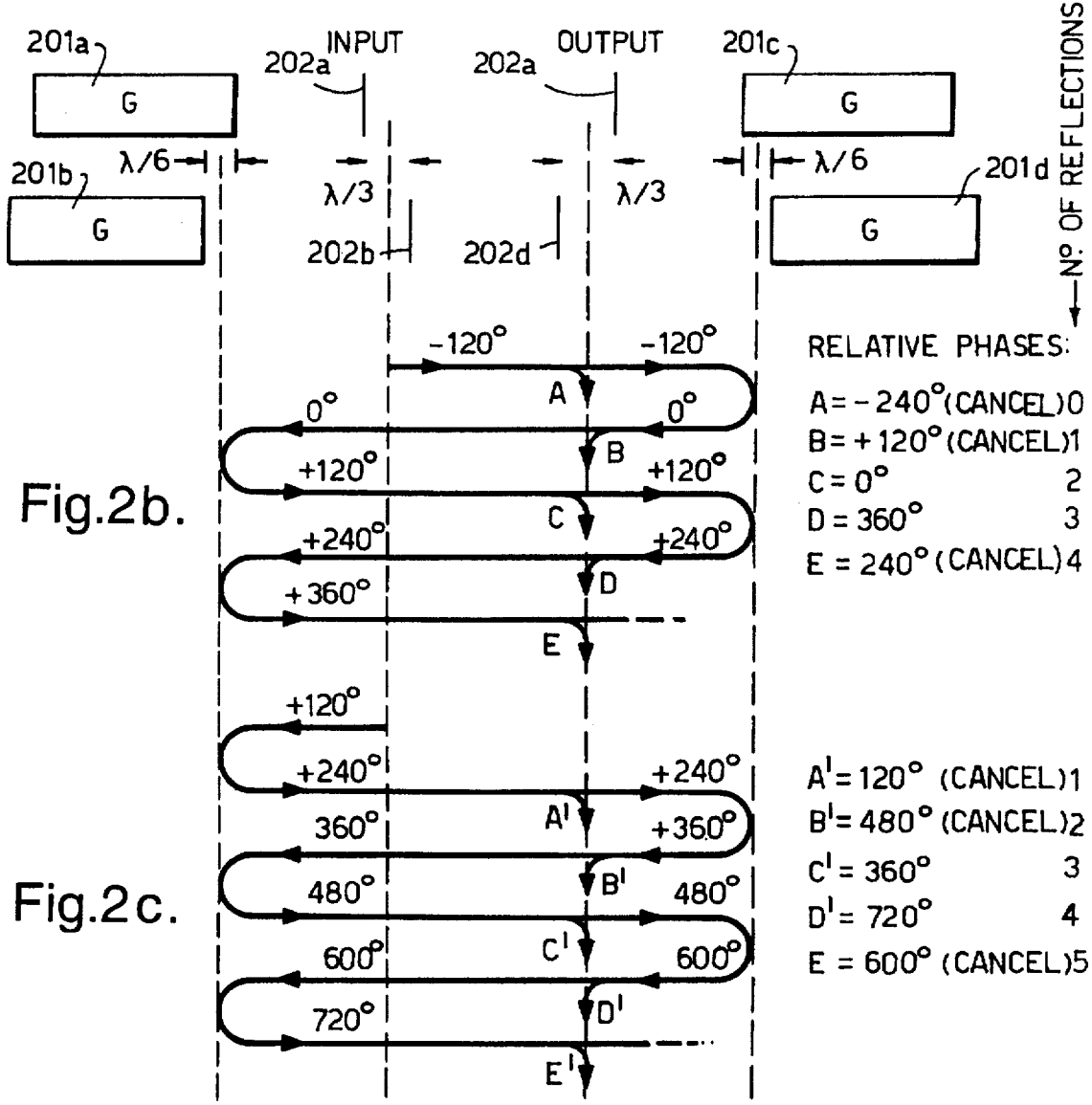

MULTI-TRACK SAW FILTER WITH REFLECTORS AND REVERSED POLARITY IDT CONNECTIONS

FIELD OF INVENTION

This invention relates to a Surface Acoustic Wave (SAW) filter. In particular, it relates to a SAW filter comprising a plurality of tracks.

BACKGROUND TO INVENTION

SAW technology has found a number of applications in the electronics and RF art. Due to the fact that SAW wavelengths are typically $10^5$ times shorter than that of electromagnetic waves having a corresponding frequency, SAW technology has found particular applications where miniaturisation is important or desirable. One such application is the use of SAW filters in radio telephones where the typically small size and weight of SAW filters is highly advantageous over conventional technologies, such as ceramic filters, dielectric filters, and filters using magnetostatic principles. Generally, it is a requirement of such filters that they have low-loss, typically insertion losses of 1-3 dB for RF use, although for IF filters an insertion loss of 5~13 dB is acceptable.

A typical example of a conventional SAW filter is a SAW filter in which SAW energy is transferred between two spaced apart interdigital transducers (IDTs). The IDTs comprise two sets of equally spaced metal strips (electrode fingers), which are formed on the surface of a piezoelectric substrate. The electrode fingers in each set are typically electrically coupled together by bus-bars and are interleaved (interdigitated) with the electrode fingers of the other set. This arrangement can generate SAWs in both directions transverse to each electrode finger when an electrical voltage is applied between the sets of electrode fingers, and it can also generate an electrical voltage when SAWs are incident on the electrode fingers. These processes are most efficient when the frequency of the SAWs is such that the periodicity of the electrode fingers in each set is close to or the same as the SAW wavelength, or some multiple of this frequency. In the simplest form of IDT, the spacing between adjacent electrode fingers of a set of electrode fingers is one SAW centre wavelength, i.e. one electrode finger per period. However, it is possible to have more than one finger per SAW wavelength (period).

A particular path for a surface acoustic wave comprising SAW elements such as IDTs and/or reflection gratings is known as a track.

For conventional filters, to a first order the lengths of the transducers substantially determine the bandwidth of the filter since BW α 1/L where L is the length of the transducers. Thus, the more narrow the bandwidth requirement the longer the transducers need to be. Increasing the length of transducers to decrease the bandwidth of the filter mitigates against advantages of small size usually associated with SAW devices. In particular, there has recently been a requirement for narrow-band filters for portable apparatus, and it is desirable to be able to provide such narrow-band devices without any increase in the size of the components and preferably with a decrease in the size of the components relative to conventional components.

BRIEF SUMMARY OF INVENTION

The present invention provides a SAW filter comprising a group of N tracks, where N is an integer greater than or equal to two, including an input interdigitated transducer (IDT) spaced apart from an output IDT and a reflector disposed substantially collinear with and adjacent the input and output IDTs, wherein respective tracks are selectable to have different effective electro-acoustic lengths such that surface acoustic waves launched into respective tracks from the input IDT undergo at least one reflection at a reflector corresponding to the output IDT prior to forming a substantially coherent signal at the output IDT.

This has the advantage that the effective length of the tracks can be increased at least threefold, thereby providing a decrease in length whilst maintaining filter performance or increasing filter performance whilst maintaining or possibly even decreasing the filter length. This makes SAW filters in accordance with the invention cheaper to design and to manufacture since less substrate material and packaging material need to be used. Additionally, SAW filters in accordance with the invention have good side lobe rejection and low loss, which makes them attractive alternatives to known SAW filters.

Furthermore, if only one input and output IDT are used the bus bars used to feed the IDTs can be easily routed so that they do not interfere with the acoustic channels. This reduces the complexity of the layout and obviates the need to consider the effect of bus bars on the acoustic propagation of the SAWs.

Alternatively, the output IDT comprises N respective output IDTs electrically coupled together and/or the input IDT comprises N respective input IDTs electrically coupled together, corresponding to the respective tracks. Suitably, there are provided N reflectors corresponding to the N respective output IDTs, and N reflectors corresponding to the N respective input IDTs.

Typically, the reflectors comprise gratings, such as conductive strips or grooves in the substrate material.

In a preferred embodiment the effective electro-acoustic lengths of respective tracks are selectable such that signals from respective tracks undergoing less than a total of N−1 reflections are mutually cancelled. This has the advantage that SAWs having a frequency substantially equal to the centre frequency of the filter undergo an optimum number of reflections for a given number N of tracks, before giving a coherent output.

Suitably, effective electro-acoustic lengths of respective tracks have phase differences relative to a reference track corresponding to $$\frac{2\pi r}{N}$$

where r corresponds to a sequential integer number of each track relative to the reference track corresponding to an arbitrary displacement in the electro-acoustic lengths.

The phase difference between respective tracks can be achieved in a number or combination of the following ways. For example, the electrode connections of at least one of the respective input or respective output IDTs may be reversed with respect to the polarity of the electrode connections of the IDTs of other tracks;

the different effective electro-acoustic lengths may be substantially provided by respective tracks having different physical separation between the input and output IDT;

the different effective electro-acoustic lengths may be substantially provided by different amounts of material disposed in respective tracks between the input and output IDT; or the different effective electro-acoustic lengths are substantially provided by electrical phase shifting networks such as inductors and/or capacitors.

Optionally, the IDTs may comprise single electrode IDTs. These are well known devices in the art and thus would be relatively straightforward to implement in the present invention.

In a particular embodiment the respective input and respective output IDT may be electrically coupled in series. This has an advantage in that it increases the input and output impedance of the SAW filter which may be desirable for some practical uses of the invention.

Suitably, the IDTs may be coupled in series and/or multi-electrode IDTs can be utilised, i.e. IDTs wherein the respective input and respective output IDTs each have more than one electrode per period.

If the different electro-acoustic lengths are substantially provided by electrodes in corresponding periods of IDTs in respective tracks having different dispositions relative to each other, then phase differences between tracks can be achieved without having to adjust the physical separation of the input and output IDTs. This has the advantage that the relative phase differences can be substantially the same for a wide band of frequencies about the centre frequency of operation of the device. Additionally, the physical displacement of IDTs is minimised or eliminated. This results in fewer phase mismatches, and hence lower side lobes, due to changes in frequency.

BRIEF DESCRIPTION OF THE DRAWINGS

FIGS. 2(a)–2(c) are a diagrammatic representation of the relative phase of surface acoustic waves propagating in adjacent tracks;

DETAILED DESCRIPTION OF EMBODIMENTS OF THE INVENTION

Specific embodiments of the invention will now be described, by way of example only, and with reference to the accompanying drawings.

Figure 1:
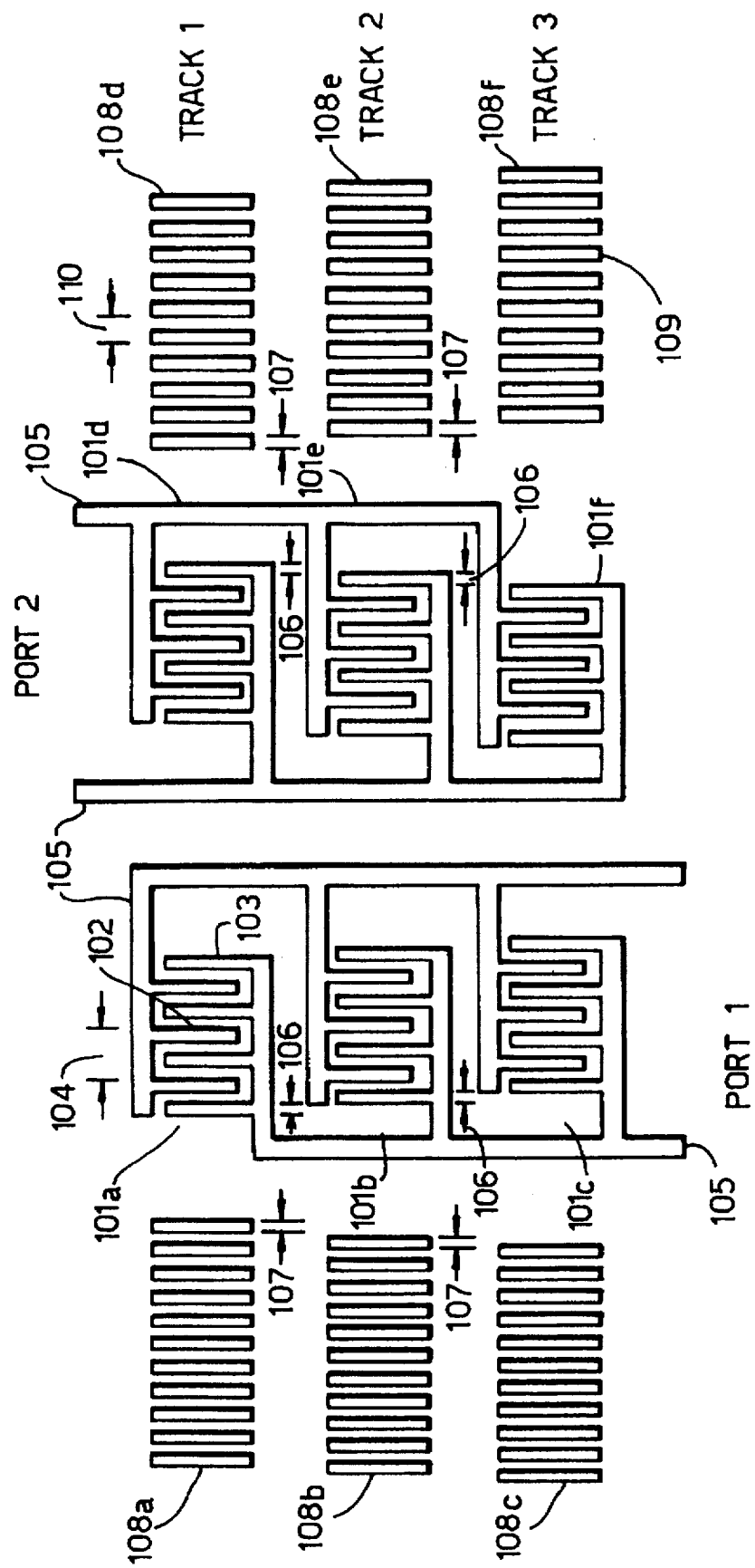
FIG. 1 is a schematic diagram of a 3 track device showing the relative dispositions of input and output IDTs, and reflection gratings.

FIG. 1 shows a three track device in accordance with the invention, having six substantially identical transducers (IDTs) 101, and six substantially identical reflection gratings 108. One grating 108 is disposed at either end of each track as shown in FIG. 1. The three left hand IDTs are connected in parallel to form an input (Port 1) and the three right hand transducers are connected in parallel to form an output (Port 2), for the device. Electrodes having the same polarity are connected together by bus-bars 105, which are also used to connect IDTs together.

Although the IDTs 101 shown in FIG. 1 have only one electrode 102, 103 connected to respective polarities per IDT period 104, this is merely to aid the clarity of the drawings and need not be the case in an actual device. The electrodes or electrode groups per period (104) connected to respective polarity bus-bars are spaced apart by one acoustic wavelength ($\lambda a$).

Each grating 108 consists of a set of equally-spaced metal strips 109, which may or may not be electrically connected together by bus-bars at the sides. FIG. 1 shows them unconnected. Typically, the strip spacing 110 is made approximately half of the SAW wavelength at the desired centre frequency of the filter although spacings of integer numbers of half wavelengths would also work. At this frequency the waves reflected by individual strips 109 are in phase with each other and consequently a grating 108 can have an appreciable reflection coefficient even though the reflection coefficient of an individual strip 109 is generally small. For this device a grating 108 will normally be designed such that its centre-frequency reflection coefficient is in the region of −2 dB to −3 dB, by appropriate choice of the film thickness and the number of strips. The metal thickness can be the same for all components, which means that the device can be fabricated by one metal deposition process followed by one process of lithography.

The device shown in FIG. 1 has three parallel paths for the surface waves, and these paths are known as "tracks", as mentioned earlier. Thus the device shown has three tracks. The components in each track, and the waves generated in each track, behave independently of the other tracks except for the electrical connections provided by the bus-bars 105. In particular, if the IDTs have a large enough beam width the diffraction of surface waves can be sufficiently controlled to inhibit any waves which are diffracted from one track to another having a detrimental effect on the device response.

Each IDT 101 of each track is disposed by a distance 106 of a third of an acoustic wavelength ($\lambda a/3$) relative to a corresponding IDT located in an adjacent track. The acoustic wavelength $\lambda a$ corresponds to the desired centre frequency of the device. Thus, IDT 101a is disposed a distance 106 of $\lambda a/3$ further to the left than IDT 101b, and IDT 101b is disposed a distance 106 of $\lambda a/3$ further left than IDT 101c. Correspondingly, IDT 101d is disposed $\lambda a/3$ further right than 101e, and IDT 101e is disposed $\lambda a/3$ further right than IDT 101f. Therefore, the spacing between input and output IDTs 101 of tracks 1 to 3 sequentially decrease by $2\lambda a/3$, such that the separation of input and output port IDTs 101 of track 2 is $2\lambda a/3$ less relative to track 1 and the separation of input and output IDTs 101 of track 3 is $4\lambda a/3$ less relative to track 1.

The gratings 108 are displaced in adjacent tracks relative to each other. Grating 108a is disposed a distance 107 of $\lambda a/6$ further to the right than grating 108b, and grating 108b is disposed a distance 107 of $\lambda a/6$ further to the right than grating 108c. Correspondingly, grating 108d is disposed a distance 107 of $\lambda a/6$ further to the left than grating 108e, and grating 108e is disposed a distance 107 of $\lambda a/6$ further to the left than grating 108f.

A signal input at port 1 is split into 3 substantially identical voltage portions, each portion applied across respective input, IDTs 101a, 101b, 101c. Each input IDT 101a, 101b, 101c launches SAWs which are respectively incident on each corresponding output IDT 101d, 101e, 101f. Since a signal applied at an input IDT and received at an output IDT undergoes both acoustic and electrical effects, a track comprising input and output IDTs shall be described as having an equivalent electro-acoustic length. This terminology refers to the fact that the effective separation of IDTs in terms of phase (which corresponds to length) is dependent upon both electrical and acoustic effects.

The operation of the device shown in FIG. 1 is now explained in more detail with reference to FIG. 2. FIG. 2(a) is a schematic representation of the device shown in FIG. 1 and shows the first two tracks of that device. The rectangular shapes represent gratings, and the vertical lines represent the centres of the transducers. The waves are taken to be generated by the transducers at the left. FIG. 2(b) represents the paths of waves launched to the right, and FIG. 2(c) represents the paths of waves launched to the left. On FIGS. 2(b) and 2(c), the phase angles marked refer to the phase of the wave in track 2 relative to the phase of the wave in track 1. The sign convention adopted is that a positive phase change corresponds to an increase in delay. The letters A, B, C, etc. refer to the electrical output signals corresponding to respective incidences of SAWs on the IDTs produced by the output transducer in track 2, with the phases shown relative track 1. It is assumed for the purpose of explanation that the transducers do not reflect the waves.

This is a valid assumption since multi-electrode transducers only reflect incident waves if a voltage is produced across the transducer. As will be explained in the following, there are many cases for a 3-track device where waves incident on respective transducers in separate tracks are phased such that no sum voltage is produced across the transducers. In such cases the waves will not be reflected and will pass through the transducers substantially unaffected. When the incident waves are phased such that there is a sum voltage across the transducers then waves are reflected from the transducers (e.g. the transducers to the right of FIG. 2). However, the reflected waves propagating to the left of FIG. 2 do not excite the input transducers directly because of the phase shifts. They do excite the input transducers after two more grating reflections, but the waves then generated by the input transducers do not excite the output transducers directly. The first spurious signal to be produced at the output transducers arrives after three further grating reflections, and so is considerably suppressed (6 to 9 dB by the grating reflections, and typically another 6 dB by the transducer reflection). Another spurious wave corresponding to C is launched to the right. This produces an output signal after one further reflection from the gratings at the right. This has a relatively high level of about 8 to 9 dB below the main output. However, its delay is the same as that of the 1st-order output signal D, which means that it will cause little distortion to the output signal of the device.

Thus, spurious signals due to reflections from the transducers themselves have very little effect on the output signals of the device and thus can be effectively ignored.

Figure 3A:
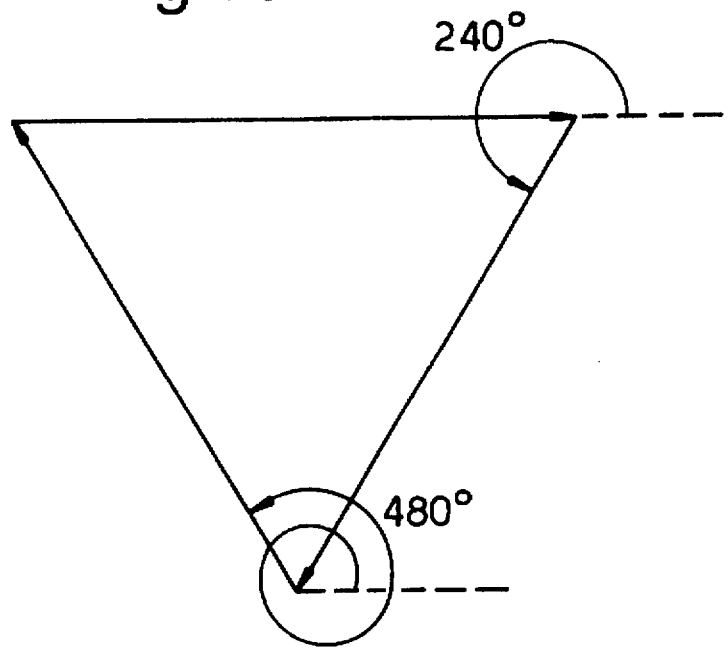
FIG. 3 shows vector representations of the relative phases of signals from individual output IDTs.
Figure 3B:
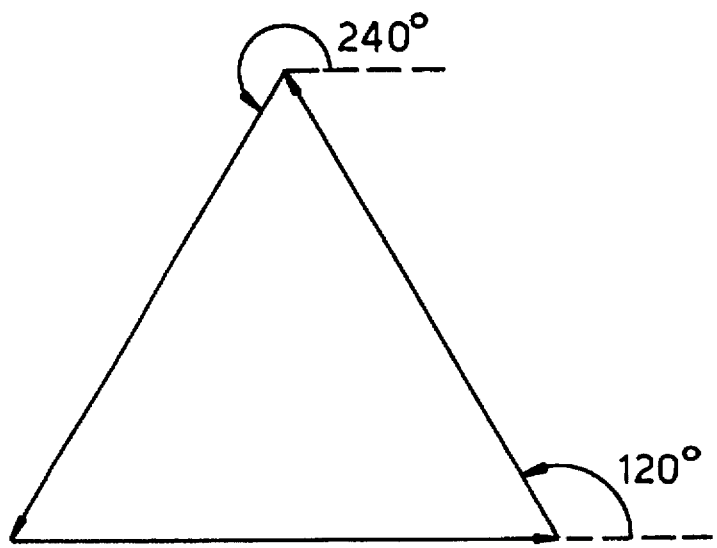

FIG. 2(b) shows a surface acoustic wave launched to the right in track 2 initially having a phase of −120° relative to a wave in track 1 because of the respective transducer displacements. On first arriving at the output transducer 202d in track 2, the wave produces an electrical output A with an additional 120° phase change due to the displacement of the output transducer in track 2 relative to the output transducer in track 1. Thus output A has a relative phase of −240° to a corresponding voltage from the output transducer in track 1. In the third track (not shown) the corresponding output A will have phase −240° relative to the second track. Thus the three output transducers give voltage outputs having relative phases 0°, −240° and −480°, and of the same amplitude. These voltage signals are added by the bus-bars connecting the transducers, giving a total signal of zero as shown in the vector diagram of FIG. 3a. The first grating reflection gives a phase change of 120° (corresponding to twice the grating displacement), so after this the wave in track 2 has a phase of 0° relative to the wave in track 1. However, the output transducer in track 2 gives a voltage output B having a phase of 120° relative to the voltage from the output transducer of track 1 due to the respective transducer displacements. In the three tracks, respective voltage outputs B have relative phases of 0°, 120° and 240°, and substantially the same amplitude, so again the total voltage signal is cancelled as shown in the vector diagram of FIG. 3(b). Following similar reasoning the voltage output C for the third incidence of the waves on the output transducer of track 2 is found to give a phase of 0° relative to the input from the output transducer in track 1 and to the output from the output transducer in track 3. Hence the outputs of the three tracks are added in phase. Thus the first coherent output signal occurs after two grating reflections and two transductions. After three reflections the output signals D are also in phase, and after four reflections the outputs E are cancelled.

FIG. 2(c) shows the situation for waves launched to the left, and similar arguments to above show that the first two signals, A' and B', are cancelled. After three reflections the signals C' are in phase, and this also applies for signals D' after four reflections.

These considerations show that the first coherent output signal is obtained after two grating reflections, though there are also contributions after three and four reflections. It should be noted that this description applies only at the nominal centre frequency of the device, where the electrode spacings correspond to one acoustic wavelength. At other frequencies the phase changes will be somewhat different and the cancellations described above will be imperfect.

The effect of multiple reflections on the bandwidth of the filter is complex. The transduction processes at the input and output IDTs each act to form a frequency response of the form sinx/x having a 4 dB bandwidth at approximately 1/T and first order nulls at 2/T where T is the length of the impulse response of respective IDTs (e.g. identical IDTs). The combined frequency response of a signal undergoing transduction at the input and output IDTs is the multiple of the individual frequency responses. Thus, the combined frequency response corresponding to the input and output IDTs has an 8 dB bandwidth at 1/T indicating a reduction in bandwidth. However, the nulls are still at the same frequencies as before relative to that of a single IDT.

A corresponding argument applies to the effect of reflections, except that now the length of the impulse response is 2T', where T' is the time corresponding to the length of a reflection grating since a SAW travels the length of a grating and back again during reflection. The effect of multiple reflections on bandwidth can be derived by multiplying the effect of each single reflection together. A single reflection yields a 4 dB bandwidth at ½T', which is narrower than for a single IDT on transduction, and 1st order nulls at 1/T'. According to the foregoing arguments, M reflections will yield a 4M-dB bandwidth at ½T', but the 1st order nulls will still be at 1/T'. Additionally, the rejection at the sidelobes will also be multiplied by M. As can be seen from the foregoing the effect of multiple reflections will dominate over the effect of the input and output transductions. This clearly shows that narrower bandwidths are obtainable from a device which utilises multiple reflections than are obtainable from a device in which the signal undergoes two transductions, both devices having IDTs of the same length. It would of course be possible to have input and output IDTs and reflection gratings of different length, but the longest IDT or reflection grating will dominate the response of the filter.

The foregoing descriptions of a device utilising 3 tracks can be generalised to an N track device having output signals which are the sums of N individual transducer signals.

$$s = \sum_{n=0}^{N-1} \exp(jn\theta) \quad (1)$$

Each track has surface acoustic waves of substantially the same amplitude, and transducers and gratings which are separated such that the effective electro-acoustic length of each track is incremented by the same amount (phase). The relationship between the total sum signal S and the individual transducer signals is given by (1).

This is easily summed as a geometric progression, giving $$s = \frac{1 - \exp(jN\theta)}{1 - \exp(j\theta)} \quad (2)$$

In the above expressions, $\theta = 2\pi I/J$, where I and J are integers. From equation (1) it is clear that S=N if $\theta$ is a multiple of $2\pi$, i.e. I/J is an integer. If $\theta$ is not a multiple of $2\pi$ the denominator of equation (2) is non-zero, and the numerator shows that S=0 if N$\theta$ is a multiple of $2\pi$, i.e. if N I/J is an integer. For J=N, $\theta=2\pi I/N$, and S=0 for all I except when I/N is an integer, in which case S=N.

Figure 4:
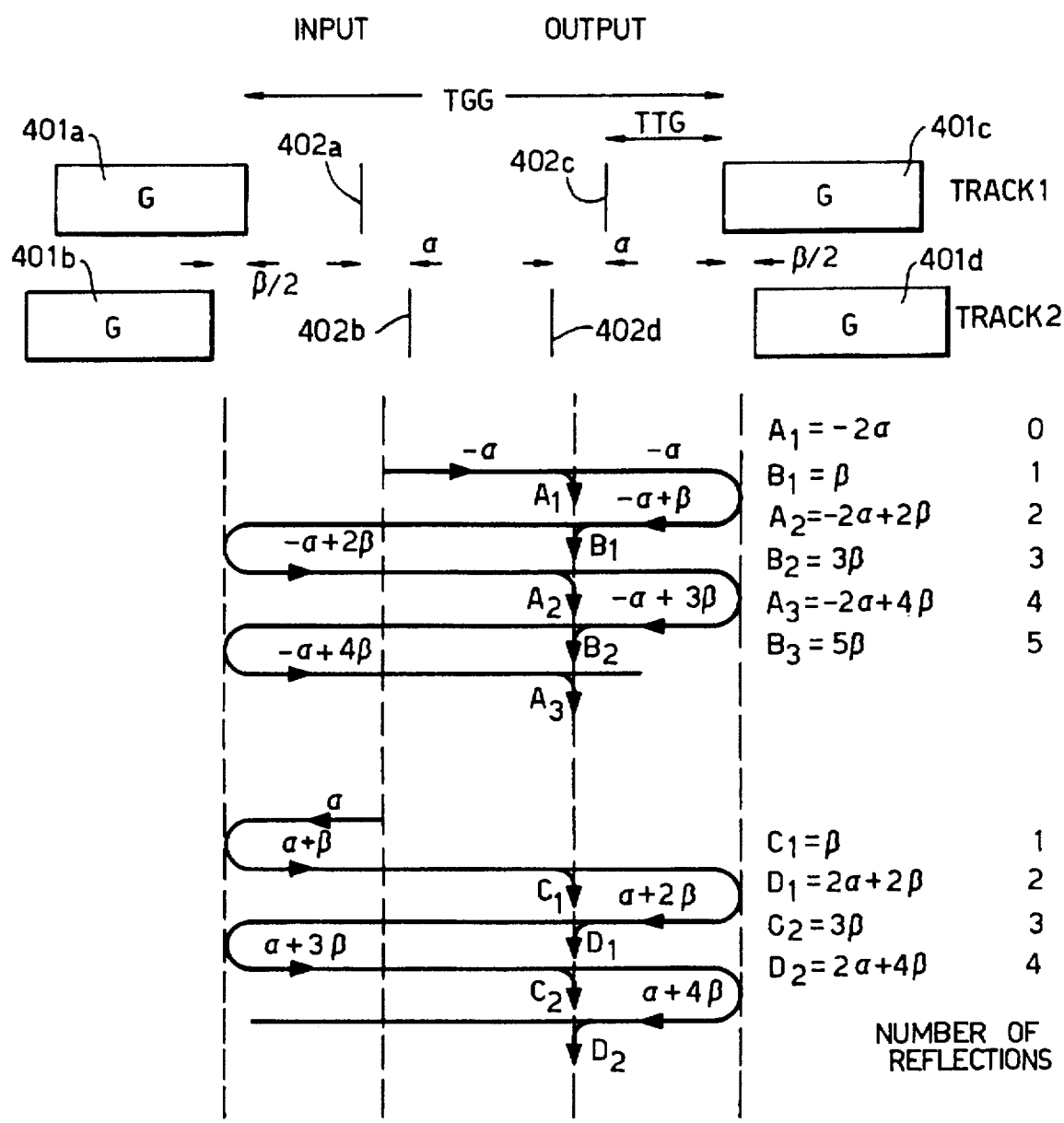
FIG. 4 is a diagrammatic representation of the general form of the relative phase of surface acoustic waves propagating in adjacent tracks.

An analysis of the signals generated in a symmetric track device is now described with reference to FIG. 4. FIG. 4 shows the first two tracks of an N-track device. Relative to the first track, the second track has its transducers 402b and 402d displaced a inwards and its gratings displaced $\beta/2$ outwards. The same relation applies for subsequent tracks. The transducers are symmetric, and transducer reflections can be ignored for the reasons explained earlier. $\alpha$ and $\beta$ are measured in centre-frequency wavelengths $\lambda a$, and the relative phases of the waves are shown normalised to $2\pi$. The output signals from the output transducers 402c, 402d . . . are due to waves launched to the right from the input transducers 402a, 402b . . . and are labelled $A_1$, $B_1$, $A_2$, $B_2$, . . . , and for waves launched to the left $C_1$, $D_1$, $C_2$, $D_2$, . . . from the output transducers 402c, 402d . . . On examining the paths of the waves, the relative phases of the outputs in track 2 relative to track 1 are found to be

| | | | |
|---|---|---|---|
| $A_n$ | = | $-2\alpha + (2n-2)\beta$ after | $2n-2$ reflections |
| $B_n$ | = | $(2n-1)\beta$ | $2n-1$ |
| $C_n$ | = | $(2n-1)\beta$ | $2n-1$ |
| $D_n$ | = | $2\alpha + 2n\beta$ | $2n$ | where n=1, 2, 3 . . . These relative phases are normalised to $2\pi$ since $\alpha$ and $\beta$ are in wavelengths.

As explained above, phase increments of the signals $A_n$, $B_n$ etc. have the form I/N (at the nominal centre frequency). The required designs are those in which there are several grating reflections before an output signal is produced. Such designs can be found by inspection. For each N (=number of tracks) $\beta$ is given values of i/N, with i=1, 2, . . . , 2N−1. Since $\alpha$ is always multiplied by 2 in the above equations, $\alpha$ is given values j/(2N), with j=1, 2, . . . , 2N−1. Upon inspection, integer values of $A_n$, $B_n$ etc. can be identified which correspond to output signals. In each case a variety of output signals is produced.

Some results are shown in Table 1, for 3, 4 and 5 tracks. In each case the table gives the number of grating reflections for the first 5 output signals. For example, the first case gives an output at transducers 402c and 402d after 2 reflections, two types of signals arising after 3 reflections and another after 4 reflections. After this there is a considerable gap, the next signal being after 8 reflections (and therefore being weak). This type of pattern is frequently produced. However, the 4-track case is different, giving signals after 2, 2, 6, 6, . . . reflections. When N is odd the designs show that up to N−1 reflections occur for the first signal, but for N even the maximum number of reflections for the first signal is N/2. The table only shows cases where the number of reflections is at or above a specified minimum (there are generally also cases with smaller numbers of reflections).

The presence of several signals having the same or similar numbers of reflections can be detrimental to the device characteristic if the relative phases of the signals are different. A further criterion must be satisfied for similar or the same signals to be in phase. These criteria can be arrived at by considering the absolute phases of the output signals produced in the first track (the phases of outputs from the other tracks are the same for the signals of interest). The absolute phase is determined by the path length taken by the acoustic wave and the phase on reflection from the gratings. We defined TGG as the distance between grating ports, and TTG as the distance between transducer centre and adjacent grating port, for the first track. These are in units of centre-frequency wavelengths. The convention adopted is that increased phase corresponds to increased delay. For each grating reflection there is a phase contribution of −90°, assuming (as usual for metal electrodes on quartz) that the reflection coefficient of one electrode in a grating is negative imaginary. The phases of the output signals in the first track are, in units of $2\pi$, $$A_n = (2n-1)*TGG - 2*TTG - (2n-2)/4$$

$$B_n = (2n-1)*TGG - (2n-1)/4$$

$$C_n = (2n-1)*TGG - (2n-1)/4$$

$$D_n = (2n-1)*TGG + 2*TTG - 2n/4$$

Signals $A_n$ and $B_n$ are due to waves launched to the right, and signals $C_n$ and $D_n$ are due to waves launched to the left. Considering the first output due to waves to the left and the first output due to waves to the right, the condition that gives these the same phase, or differing by $2\pi M$, can be found (where M is an integer). This condition is shown in Tables 1a and 1b.

TABLE 1a

NUMBER OF TRACKS - 3
MINIMUM NUMBER OF REFLECTIONS CONSIDERED - 2

| ALPHA $\lambda a$ | BETA $(2\lambda a)$ | NUMBER OF REFLECTIONS | PHASE CONDITION |
|---|---|---|---|
| 1/6 | 1/6 | 2 3 3 4 8 . . | −2*TGG + 2*TTG + .250 = M |
| 1/6 | 2/6 | 2 3 3 4 5 . . | 0*TGG + 2*TTG + −.250 = M |
| 2/6 | 1/6 | 2 3 3 4 8 . . | 0*TGG + 2*TTG + −.250 = M |
| 2/6 | 2/6 | 2 3 3 4 8 . . | −2*TGG + 2*TTG + .250 = M |

TABLE 1a-continued

| | | | |
|---|---|---|---|
| 4/6 | 1/6 | 2 3 3 4 8 .. | $-2*TGG + 2*TTG + .250 = M$ |
| 4/6 | 2/6 | 2 3 3 4 8 .. | $0*TGG + 2*TTG + -.250 = M$ |
| 5/6 | 1/6 | 2 3 3 4 8 .. | $0*TGG + 2*TTG + -.250 = M$ |
| 5/6 | 2/6 | 2 3 3 4 8 .. | $-2*TGG + 2*TTG + .250 = M$ |

NUMBER OF TRACKS - 4
MINIMUM NUMBER OF REFLECTIONS CONSIDERED - 2

| ALPHA $\lambda a$ | BETA $(2\lambda a)$ | NUMBER OF REFLECTIONS | PHASE CONDITIONS |
|---|---|---|---|
| 2/8 | 1/8 | 2 2 6 6 10 .. | $-2*TGG + 4*TTG + .000 = M$ |
| 2/8 | 3/8 | 2 2 6 6 10 .. | $-2*TGG + 4*TTG + .000 = M$ |
| 6/8 | 1/8 | 2 2 6 6 10 .. | $-2*TGG + 4*TTG + .000 = M$ |
| 6/8 | 3/8 | 2 2 6 6 10 .. | $-2*TGG + 4*TTG + .000 = M$ |

TABLE 1b

NUMBER OF TRACKS - 5
MINIMUM NUMBER OF REFLECTIONS CONSIDERED - 3

| ALPHA $\lambda a$ | BETA $(2\lambda a)$ | NUMBER OF REFLECTIONS | PHASE CONDITION |
|---|---|---|---|
| 1/10 | 1/10 | 4 5 5 6 14 .. | $-2*TGG + 2*TTG + .250 = M$ |
| 1/10 | 4/10 | 4 5 5 6 14 .. | $0*TGG + 2*TTG + -.250 = M$ |
| 2/10 | 2/10 | 4 5 5 6 14 .. | $-2*TGG + 2*TTG + .250 = M$ |
| 2/10 | 3/10 | 4 5 5 6 14 .. | $0*TGG + 2*TTG + -.250 = M$ |
| 3/10 | 2/10 | 4 5 5 6 14 .. | $0*TGG + 2*TTG + -.250 = M$ |
| 3/10 | 3/10 | 4 5 5 6 14 .. | $-2*TGG + 2*TTG + .250 = M$ |
| 4/10 | 1/10 | 4 5 5 6 14 .. | $0*TGG + 2*TTG + -.250 = M$ |
| 4/10 | 4/10 | 4 5 5 6 14 .. | $-2*TGG + 2*TTG + .250 = M$ |
| 6/10 | 1/10 | 4 5 5 6 14 .. | $-2*TGG + 2*TTG + .250 = M$ |
| 6/10 | 4/10 | 4 5 5 6 14 .. | $0*TGG + 2*TTG + -.250 = M$ |
| 7/10 | 2/10 | 4 5 5 6 14 .. | $-2*TGG + 2*TTG + .250 = M$ |
| 7/10 | 3/10 | 4 5 5 6 14 .. | $0*TGG + 2*TTG + -.250 = M$ |
| 8/10 | 2/10 | 4 5 5 6 14 .. | $0*TGG + 2*TTG + -.250 = M$ |
| 8/10 | 3/10 | 4 5 5 6 14 .. | $-2*TGG + 2*TTG + .250 = M$ |
| 9/10 | 1/10 | 4 5 5 6 14 .. | $0*TGG + 2*TTG + -.250 = M$ |
| 9/10 | 4/10 | 4 5 5 6 14 .. | $-2*TGG + 2*TTG + .250 = M$ |

It should be noted that the invention is not limited to the foregoing description, but may be expanded to cover cases where $\alpha$ and $\beta$ have different signs. Also, there could be three independent displacements from track to track.

A comparison of the device characteristics for devices utilising different numbers of tracks is shown in FIG. 6. FIG. 6 shows 3 devices, all with substantially the same transducers and gratings. All of the devices are built on ST-quartz having an effective permittivity ($e^T_{PR}$) of 4.55, a piezoelectric coupling coefficient ($\Delta v/v$) of 0.0006 and a centre frequency of 71 MHz. The transducers each have 50 periods with 4 electrodes per period and apertures of 1 mm and the gratings each have 120 strips with individual reflection coefficients (r/j) of −0.007.

Figure 6A:
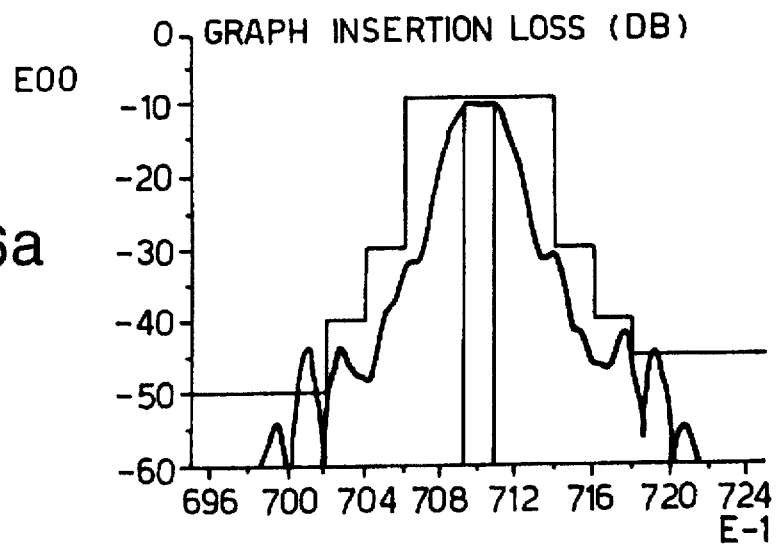
FIGS. 6(a)–6(c) show results for 3 track and 5 track symmetric devices and a 5 track non-symmetric device.

FIG. 6(a) shows the device characteristic for a three track device. This device has symmetrically disposed transducers and gratings, similar to those shown in FIGS. 2 and 4. In the first track the TGG distance is 125$\lambda a$ and the TTG distance is 26⅙$\lambda a$. The displacements from one track to the next are respectively;

−$\lambda a$/6 for the leftmost grating, $\lambda a$/3 for the leftmost transducer, −$\lambda a$/3 for the rightmost transducer, and $\lambda a$/6 for the rightmost grating.

where a positive displacement indicates that the component is displaced to the right, and a negative displacement indicates displacement to the left.

Figure 6B:
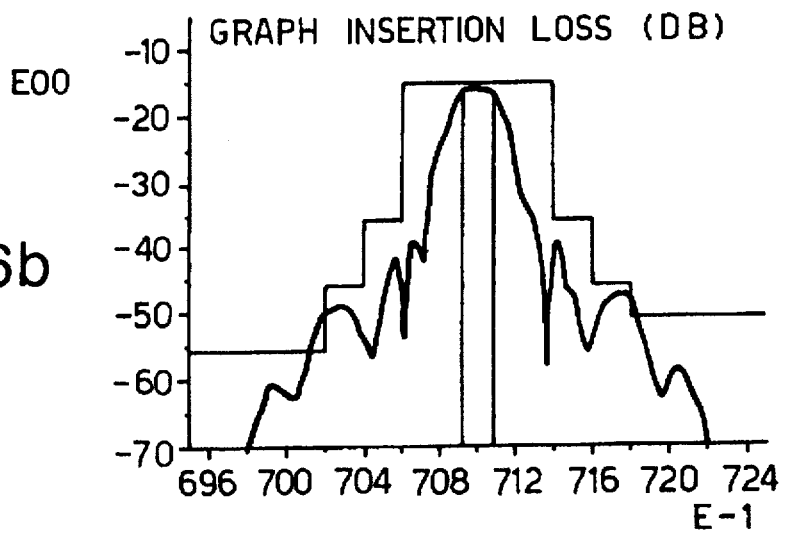

FIG. 6(b) shows the device characteristic for a symmetric five track device having a first track set up as in the device of FIG. 6(a) and corresponding to the second 5 track design of Table 1, where the displacements from one track to the next one are respectively;

−0.4$\lambda a$ for the leftmost grating, 0.1$\lambda a$ for the leftmost transducer, −0.1$\lambda a$ for the rightmost transducer, and 0.4$\lambda a$ for the rightmost grating.

Figure 5:
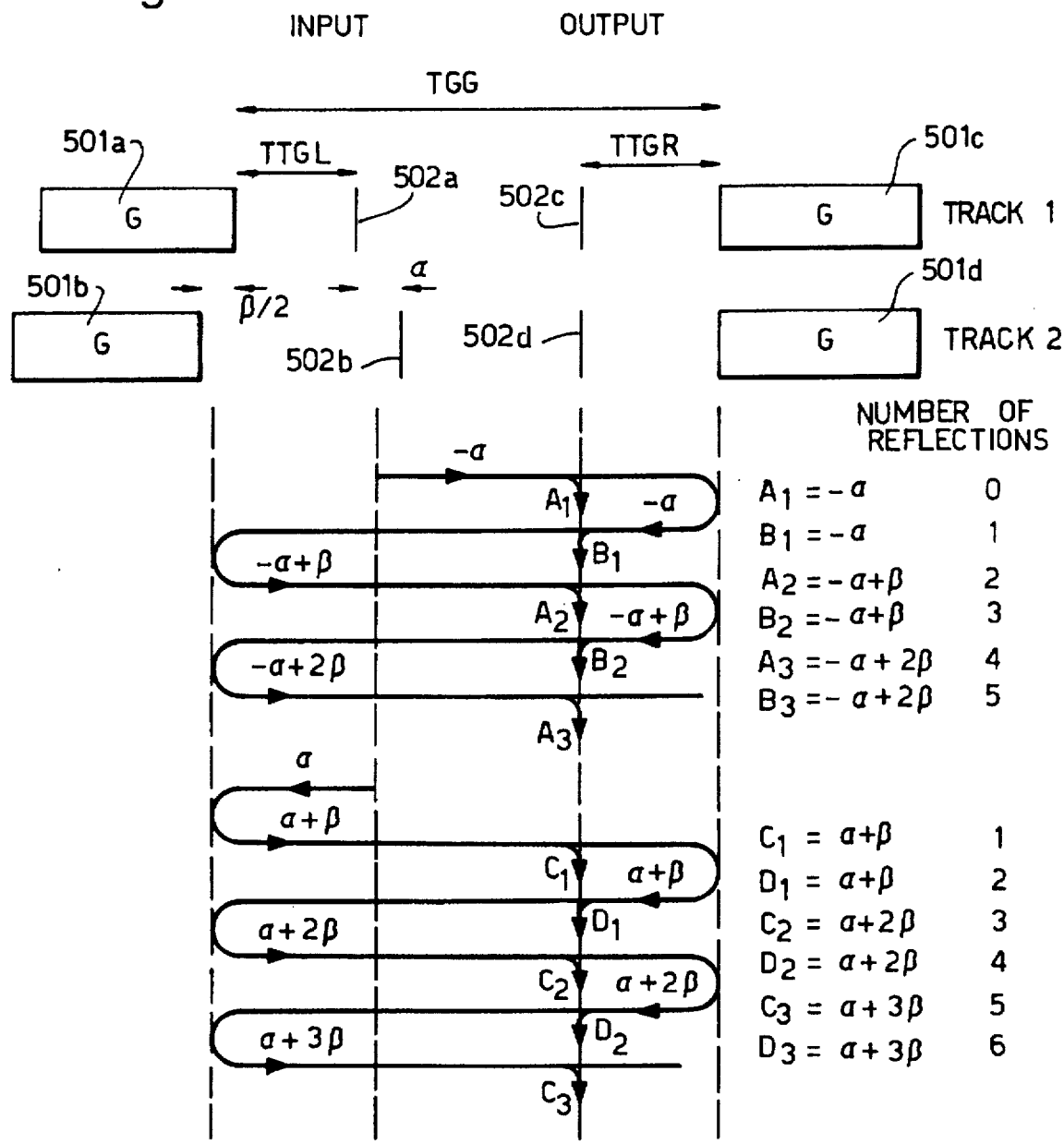
FIG. 5 is a diagrammatic representation of the general form of the relative phase of surface acoustic waves propagating in adjacent tracks for a non-symmetric device.
Figure 6C:
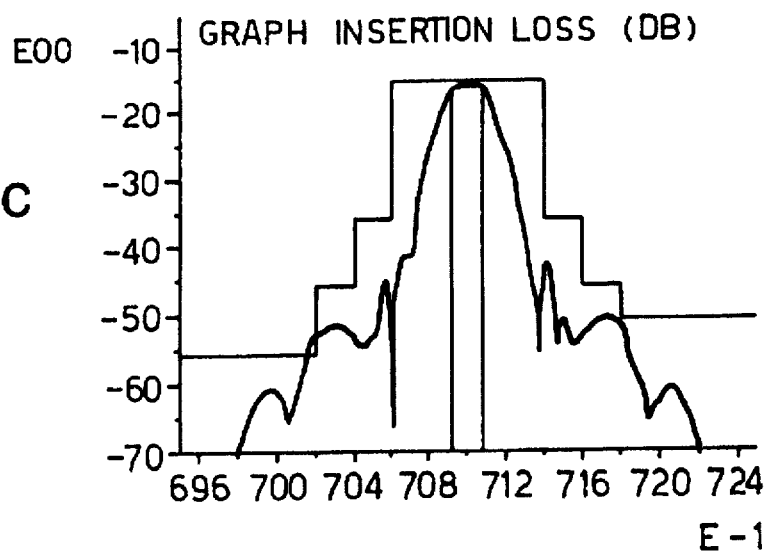

FIG. 6(c) shows the device characteristic for a five track device having non-symmetrically disposed transducers and gratings, similar to those shown in FIG. 5 and corresponding to the second 5 track design shown in Table 2c. The displacements from one track to the next are as follows;

−0.3$\lambda a$ for the leftmost grating, 0.2$\lambda a$ for the leftmost transducer, zero for the rightmost transducer, and zero for the rightmost grating.

For the purpose of clarification, it should be noted that the terms leftmost and rightmost refer to the disposition of transducers and gratings as shown in FIGS. 2, 4 and 5. The 5-track devices clearly have narrower bandwidths (144 kHz and 140 kHz respectively) than the 3-track device (152 kHz) despite using the same transducer and grating designs. This indicates that for the same bandwidth the device could be made shorter.

The foregoing analysis was based on inspection of numerical algorithms. The following is an algebraic analysis of a device corresponding to that shown in FIG. 5. The general principle explained here can be applied to other configurations, such as symmetric displacements of transducers and gratings.

FIG. 5 shows the first 2 tracks of an N-track device, where the left transducer 502a, 502b . . . and grating 501a, 501b . . . are displaced by $\alpha$ and $\beta/2$ from track to track. The phases shown in the lower part of FIG. 5 are phases of waves in track 2 relative to track 1 (and also track 3 relative to track 2, etc.). Phases shown for transducer output voltages are also relative. These are given by the following formulae:

(3)

| | No. of reflections |
|---|---|
| Relative phase of o/p $A_n = -\alpha + (n-1)\beta$ | $2n - 2$ |
| Relative phase of o/p $B_n = -\alpha + (n-1)\beta$ | $2n - 1$ |
| Relative phase of o/p $C_m = \alpha + m\beta$ | $2m - 1$ |
| Relative phase of o/p $D_m = \alpha + m\beta$ | $2m$ | where n and m are positive integers.

In order to cancel signals with small values of n or m, $\alpha$ and $\beta$ are taken to have the forms $\alpha = 2\pi r/N$ $\beta = 2\pi s/N$ where r and s are integers but not multiples of N (the number of tracks).

The values of r and s are required to be such that the first coherent output signal involves N−1 reflections. This is to maximise the effect of having N tracks. Signals $B_n$ or $D_m$ do not need to be considered because they have the same relative phases as $A_n$ and $C_m$. If the first output signal is $A_n$, this involves an even number of reflections, so N must be odd. If the first output is $C_m$ then this would have taken an odd number of reflections, so N must be even. Hence even and odd values of N must be considered separately.

For an even number of tracks the first coherent output must be $c_m$, after 2m−1 reflections. To satisfy the criterion that there are N−1 reflections we have m=N/2 which is an integer because N is even. A satisfactory design is obtained by setting r=an odd multiple of N/2;

s=an integer which is not a multiple of N and does not have any factors in common with N.

With this choice of r and s, the output signals $C_m$, $D_m$, $A_{m+1}$ and $B_{m+1}$, are all substantially coherent (for m=N/2). The number of reflections involved is respectively N−1, N, N, N+1. Also, all signals with smaller values of m are found to be cancelled. These conclusions can be confirmed by substitution in the relative phases given earlier (equation (3)).

In addition, the output signals $C_m$, $D_m$, $A_{m+1}$ and $B_{m+1}$, should be substantially in phase with each other. To do this, it is sufficient to consider only the first track. Distances between components are denoted TGG, TTGL and TTGR as defined in FIG. 5, these being in wavelengths. The phases of the output signals of the first track are given below:

$$\phi_1(A_n) = (2n − 1)*TGG − TTGL − TTGR − (2n − 2)/4 \quad (4)$$
$$\phi_1(B_n) = (2n − 1)*TGG − TTGL − TTGR − (2n − 1)/4$$
$$\phi_1(C_n) = (2m − 1)*TGG − TTGL − TTGR − (2m − 1)/4$$
$$\phi_1(D_n) = (2m − 1)*TGG − TTGL − TTGR − m/2$$

where the phases are in units of $2\pi$. The distances refer to the transducer centres (assuming the transducers are symmetrical) and the grating ports. The port of a grating is taken to be just outside the physical structure, at a distance p/2 from the centre of the first strip, where p is the grating pitch (=$\lambda_a$/2). The formulae assume that the reflection coefficient of each grating strip is negative imaginary, which is usually the case.

Setting $\phi_1(C_m)$, $\phi_1(D_m)$, $\phi_1(A_{m+1})$ and $\phi_1(B_{m+1})$ to be all equal leads to the conditions $$−2*TGG+2*TTGL+¼=M \quad (5)$$
$$TTGR=L/2+⅛ \quad (6)$$

where M and L are arbitrary integers.

In summary, the design prescription for even N is a) r must be an odd multiple of N/2;

b) s is any integer which is not a multiple of N and does not have any factors in common with N;

c) the spacings in the first track should comply with equations (5) and (6), these being independent of N.

For an odd number of tracks the first coherent output is $A_n$, which has 2n−2 reflections. So to satisfy the criterion that there are for reflections we have n=(N+1)/2

A satisfactory design is obtained by setting s=any integer which is not a multiple of N and does not have any factor in common with N;

for each s, possible values of r are obtained from the equation $$−r+s(N−1)/2=K*N \quad (7)$$

where K is any integer.

With these choices for r and s, the output signals $A_n$, $B_n$, $C_n$, and $D_n$ are all substantially coherent, for n=(N+1)/2. The number of reflections involved is respectively N−1, N, N, and N+1. Also, all signals with smaller values of n are found to be cancelled. These conclusions can be confirmed by substitution in the relative phases given earlier (equation (3)).

In a manner similar to before, the four signals $A_n$, $B_n$, $C_n$, and $D_n$ should be substantially in phase with each other. For this it is sufficient to consider the phases of the output signals for the first track, given by equation (5) above. Setting $\phi_1(A_n)$, $\phi_1(B_n)$, $\phi_1(C_n)$ and $\phi_1(D_n)$ to be all equal leads to the conditions $$2*TTGL−¼=M \quad (8)$$
$$TTGR=L/2+⅛ \quad (9)$$

where M and L are arbitrary integers. These equations do not place any constraint on the grating separation TGG.

In summary, the design prescription for an odd number of tracks is:

a) s is any integer which is not a multiple of N and does not have any factors in common with N;

b) for each s, possible values of r are obtained from equation (7) above;

c) in the first track the spacings must comply with equations (8) and (9), these being independent of N.

In the foregoing examples, the input and output IDTs are respectively coupled together in parallel. However, they could also be coupled together in series. There is no basic difference between the operation of devices having parallel or series coupling between IDTs. This can be explained by the following.

In response to incident waves, the phases of the transducer open-circuit voltages have the same increment from track to track as the incident waves. If the transducer open-circuit voltages are phased such that their sum is zero, there will be zero voltage across the device terminals. If the transducer open-circuit voltages have the same phase, a useful voltage is produced across the device terminals. These features are true irrespective of whether the transducers are connected in parallel or in series. However, the above descriptions of the device operation assume that the transducers do not substantially reflect when the open-circuit voltages sum to zero; therefore the device needs to be designed such that reflections in this situation are adequately suppressed. For multi-electrode transducers this requirement is easily met; for parallel connection the reflection coefficient is always small, and for series connection the reflection coefficient is generally small. For single-electrode transducers the reflection coefficient is often large, but it could be minimised by using relatively short transducers or (in the case of a weekly piezoelectric substrate such as quartz) by using a sufficiently thin film.

An important difference between devices utilising series or parallel coupling is that different electrical matching is required. For example, the capacitance due to series coupled IDTs would be small compared to the capacitance of such IDTs coupled in parallel. Thus, a large inductor would be required to tune out the capacitance of the series coupled IDTs.

In the foregoing example the phase difference between tracks is obtained by appropriately displacing IDTs in one track relative to those in adjacent tracks. However, any method of providing a phase difference between tracks would be suitable for use in the present invention. For example, different length metal pads may be disposed between input and output IDTs or IDTs and gratings of respective tracks. The effect of the metal pads would be to alter the velocity of a SAW as it propagated below the metal pad. Thus, different length pads would introduce phase differences between tracks. Also, respective input or output IDTs could be connected to each other via conventional electrical phase changing circuits comprising components such as inductors and capacitors.

Further ways of producing phase differences in adjacent tracks can be achieved by utilising different electrode structures or connections. For example, in a device utilising three tracks and multi-electrode IDTs having 3 electrodes per period a similar effect to having adjacent IDTs displaced by $\lambda/3$ can be achieved by appropriately connecting the electrodes in IDTs disposed in line with each in adjacent tracks. If each polarity electrode connection is represented by a + or − sign then the following tables show the electrode connections.

TABLE 3

| Track 1: | + | + | − | + | + | − | + | + | − | ... |
| Track 2: | + | − | + | + | − | + | + | − | + | ... |
| Track 3: | − | + | + | − | + | + | − | + | + | ... |

Alternatively, the electrodes could be connected thus.

TABLE 4

| Track 1: | − | − | + | − | − | + | − | − | + | ... |
| Track 2: | − | + | − | − | + | − | − | + | − | ... |
| Track 3: | + | − | − | + | − | − | + | − | − | ... |

The waves generated by IDTs in tracks 2 and 3 having electrodes connected in accordance with one of the schemes shown above have phases differing by 120° and 240° respectively relative to the IDT in track 1. Such IDTs could be utilised in separate tracks of a three track device to provide the requisite phase differences between tracks without having to displace IDTs.

Figure 1A:
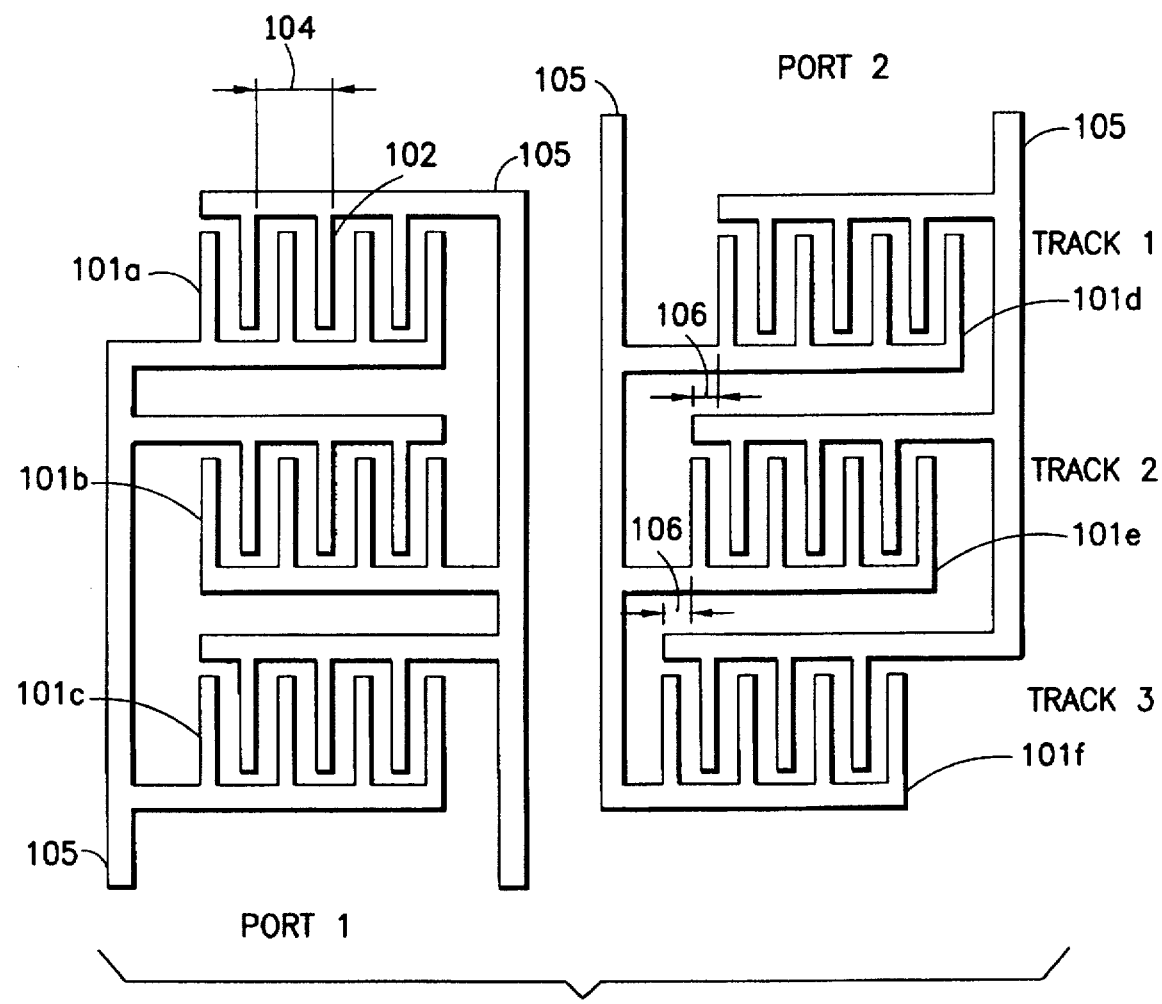
FIG. 1a is a schematic diagram of a 3 track device with an electrode connection of one IDT reversed.

Another way of utilising electrode structure and electrical connections to obtain phase differences is to invert the electrode connections in an input or output IDT. Again, using the three track device as an example it is possible to obtain $\lambda a/3$ (120°) phase displacements by a $\lambda a/6$ (60°) displacement plus electrode reversal, as seen in FIG. 1a, wherein the electrode connection of IDT 101b is reversed with respect to the polarity of the electrical connections of the IDTs of the other tracks. The reversal effectively gives a $\lambda a/2$ phase displacement which by subtracting $\lambda a/6$ gives $\lambda a/3$ (120°) phase displacement, and by adding $\lambda a/6$ gives $2\lambda a/3$ (240°) phase displacement. Since there is a small phase displacement between adjacent tracks $-\lambda a/6$ and $+\lambda a/6$, the direct coupling between input and output IDTs is reduced, which reduces the side-lobe levels compared with devices having phase displacements of $\lambda a/3$ between adjacent tracks.

In the case of a non-symmetric device, as in FIG. 5, the transducer phase differences can be implemented straightforwardly if the number of tracks is any even number. In this case the device can use transducer displacements of $\lambda a/2$. The effect of these displacements can be obtained, at the centre frequency, by reversing the polarities of selected transducers instead of using displacements. This has the additional advantage that the direct coupling between input and output IDTs is cancelled at all frequencies, thus reducing the sidelobes of the device response.

Figure 7:
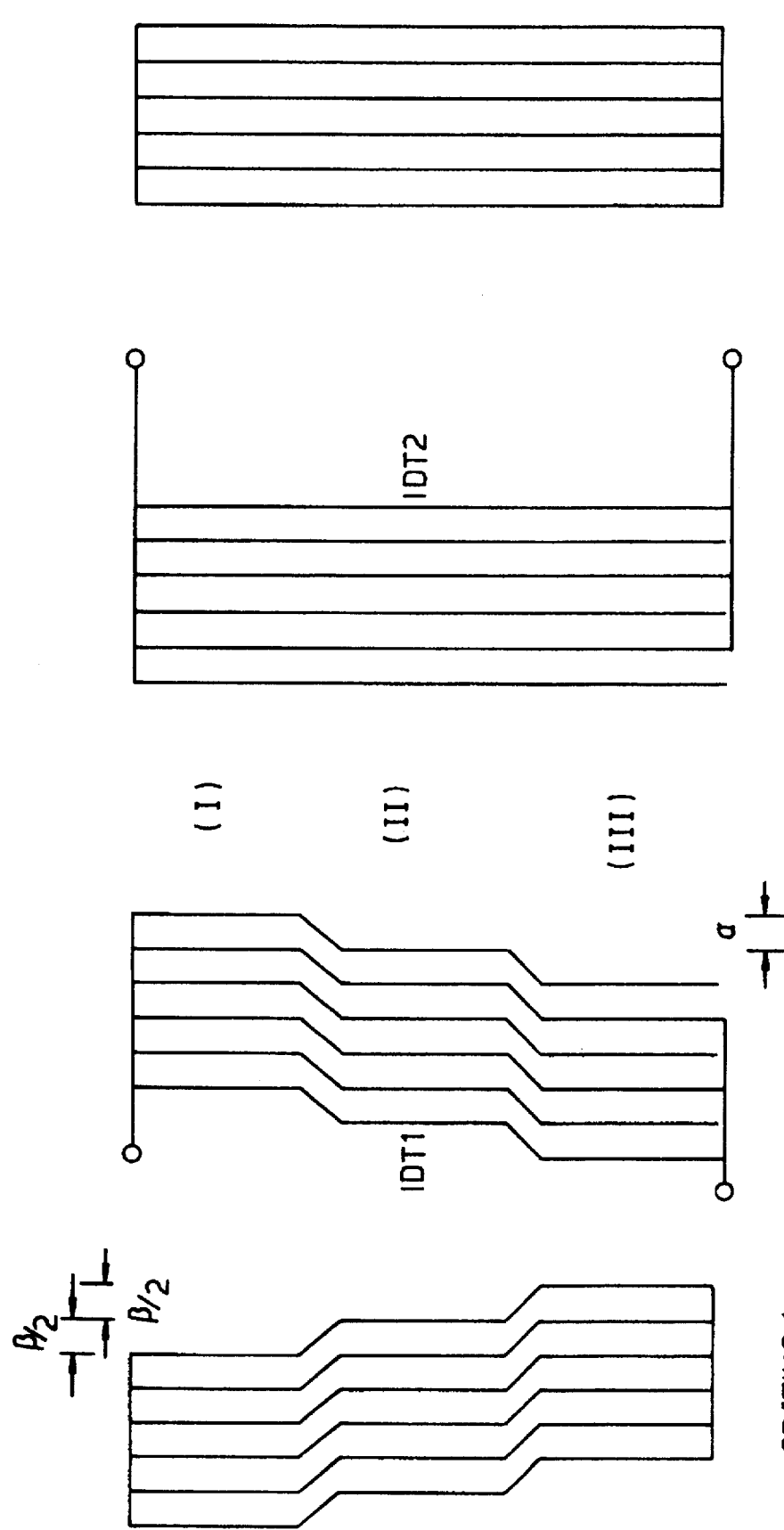
FIG. 7 shows an arrangement where the IDTs and gratings have their electrodes or reflectors joined together.
Figure 8:
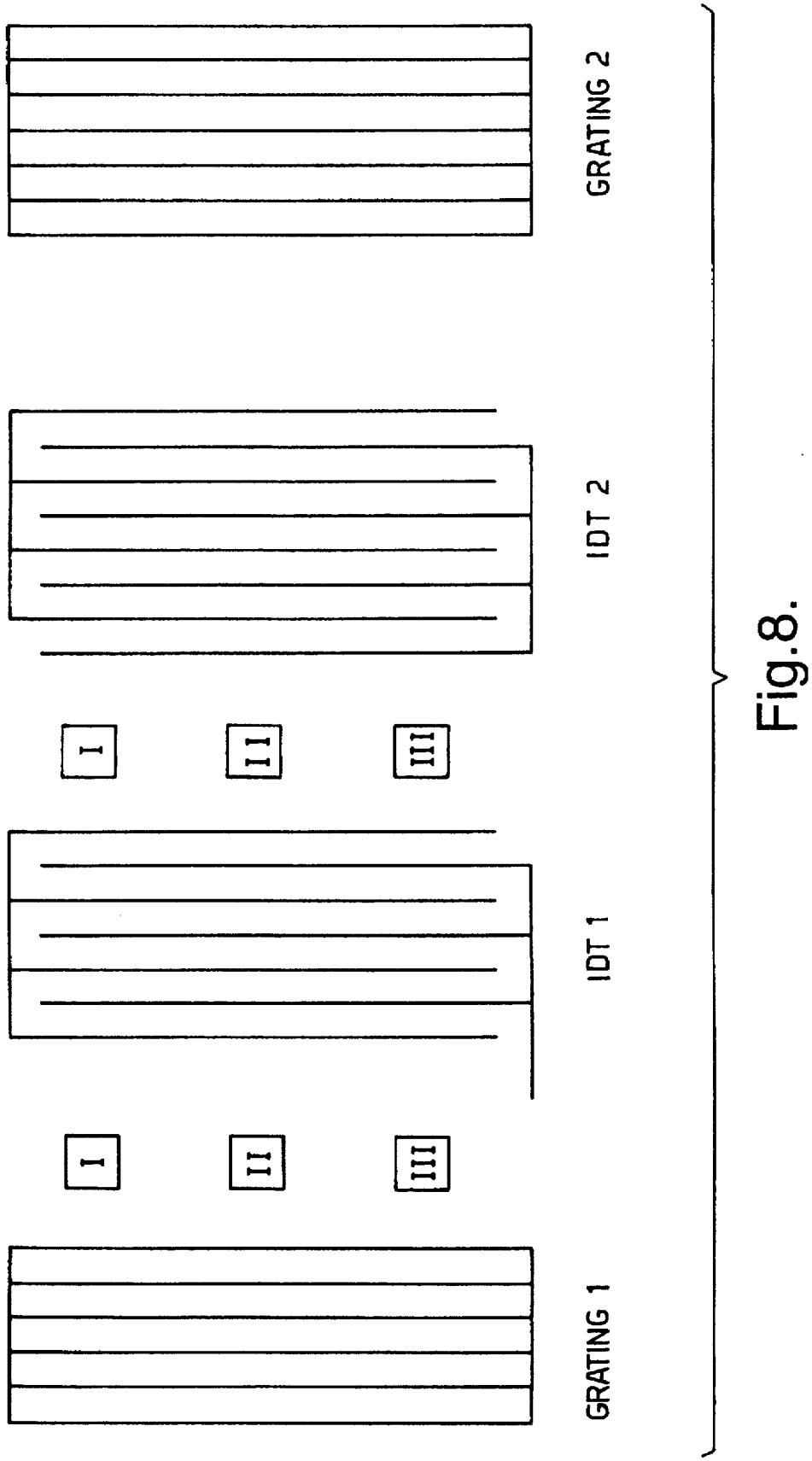
FIG. 8 shows an alternative arrangement where the IDTs and gratings have their electrodes or reflectors joined together.

Although the foregoing examples refer to devices having tracks in which adjacent input or output IDTs are separate this need not be the case. An IDT could have all the electrode fingers corresponding to different tracks connected together. FIGS. 7 and 8 show examples of such arrangements. In FIG. 7 the electrodes of IDT 1 are bent so that regions of the electrodes are respectively displaced by α and 2α with respect to a reference region and the grating electrodes are bent so that there is β/2 and 2β/2 displacement between adjacent gratings. These different regions effectively create different adjacent tracks, labelled (I), (II) and (III) in FIG. 7, each being out of phase with the others. Waves launched from IDT1 undergo transduction and the resulting voltages combine. If they are coherent then an output voltage is produced if they are not then zero net voltage is produced and the wave is reflected.

Figure 9:
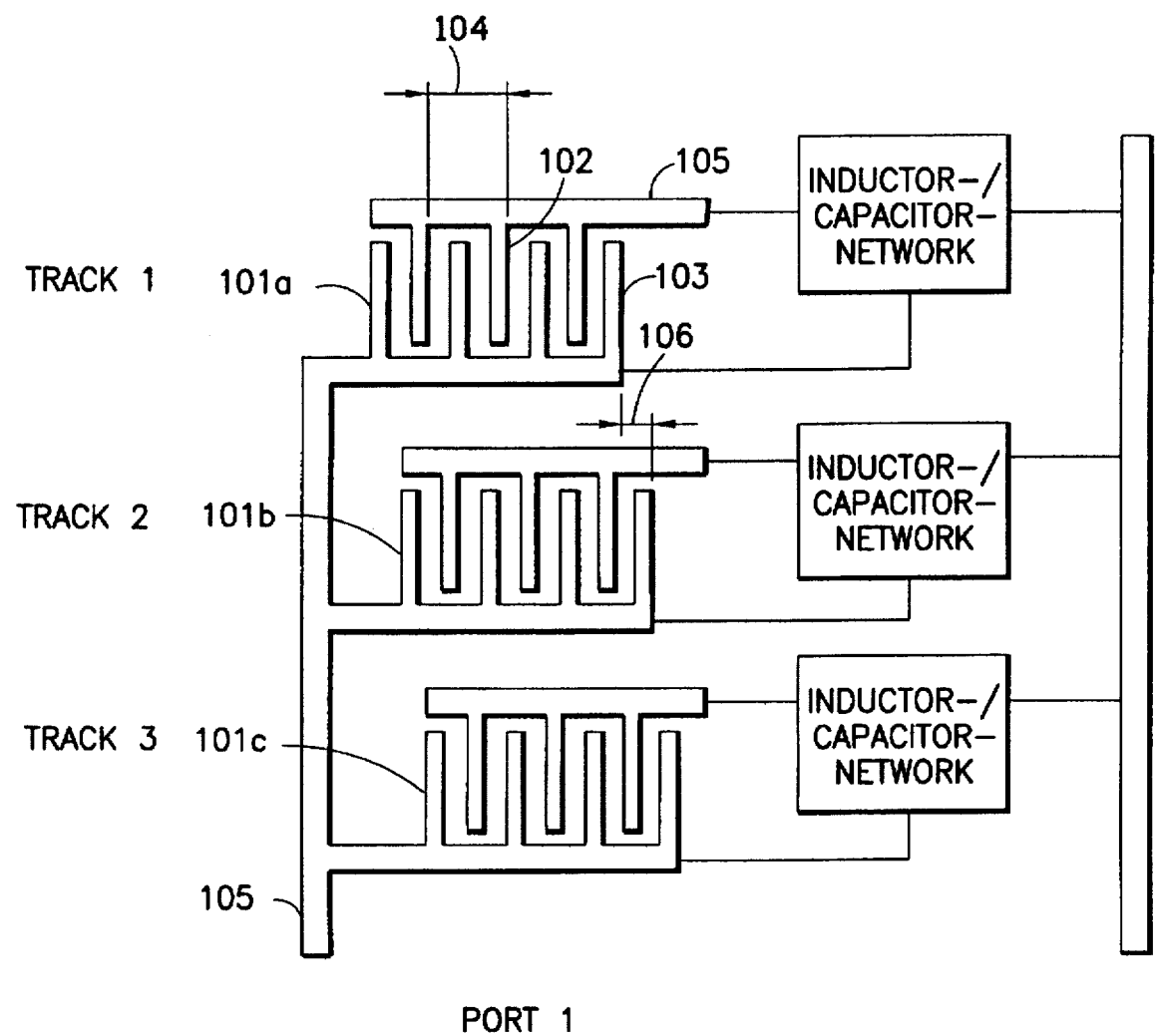
FIG. 9 is a schematic view of an electrical phase shifting network.

A similar situation is shown in FIG. 8, but in this example the phase differences are provided by metal pads I, II and III which define three adjacent tracks having different phases. For the state of clarity and to avoid any doubt, references to tracks in the description and claims shall also be taken to include regions as defined above. As seen in FIG. 9, different effective electro-acoustic lengths could be substantially provided by electrical phase shifting networks such as inductors and/or capacitors.

Figure 1B:
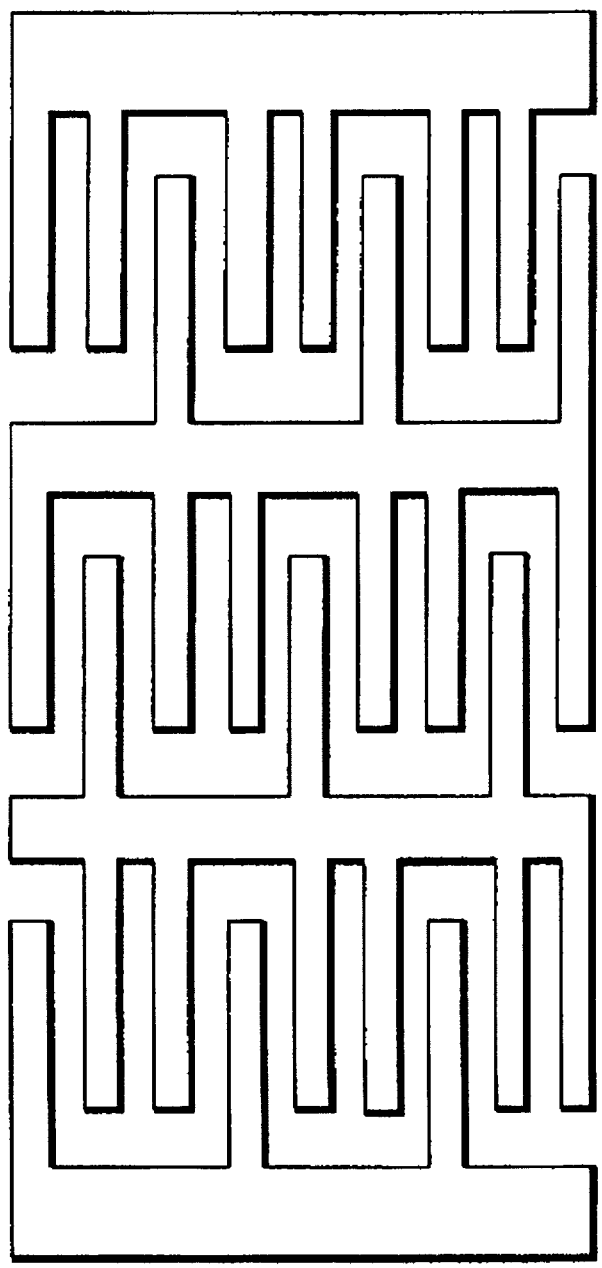
FIG. 1b is a schematic diagram of a prior art transducer.

In view of the foregoing description it will be evident to a person skilled in the art that various modifications may be made within the scope of the invention and for example, in addition to the conventional Surface Acoustic Wave other types of wave are often used for devices similar to SAW devices in which transduction is accomplished by metal strips applied to the surface. These include surface-skimming bulk waves (SSBWs), leaky waves and surface transverse waves (STWs). The present invention is applicable to these waves as well as SAWs. For these waves it is quite common to include structures such as grooves or metal gratings in regions between the active components, in order to confine the waves at the substrate. A device in accordance with the present invention could if necessary include such structures, with the design allowing for velocity shifts in these structures as necessary. Additionally, the form of the electrodes in each transducer and of the strips in each grating may vary, for example in width, spacing or number per period, i.e. giving weighted or apodized transducers or gratings. FIG. 1b shows an example of a prior art transducer with more than one electrode per period, wherein the different electro-acoustic lengths are substantially provided by electrodes in corresponding periods of IDTs in respective tracks having different dispositions relative to each other, and wherein respective output IDTs and respective input IDTs are electrically coupled in series.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during prosecution of this application or of any such further application derived therefrom.

What I claim is:

1. A SAW filter comprising a group of N tracks, where N is an integer greater than or equal to two, including an input interdigitated transducer (IDT) spaced apart from an output IDT and a reflector disposed substantially collinear with and adjacent the input and output IDTs, wherein respective tracks are selected to have different effective electro-acoustic lengths such that surface acoustic waves launched into respective tracks from the input IDT undergo at least one reflection at a reflector corresponding to the output IDT prior to forming a substantially coherent signal at the output IDT, wherein the output IDT comprises N respective output IDTs electrically coupled together and corresponding to said respective tracks, and wherein the electrode connections of at least one of the respective IDTs are reversed with respect to the polarity of the electrode connections of the IDTs of other ones of the tracks.

2. A SAW filter according to claim 1, wherein the surface accoustic waves undergo at least one reflection from a reflector corresponding to said input IDT prior to forming a substantially coherent signal at the output IDT.

3. A SAW filter according to claim 1, wherein respective output IDTs and respective input IDTs are electrically coupled in series.

4. A SAW filter according to claim 1, wherein there are provided N reflectors corresponding to the N respective output IDTs.

5. A SAW filter according to claim 1, wherein the input IDT comprises N respective input IDTs electrically coupled together and corresponding to said respective tracks.

6. A SAW filter according to claim 5, wherein there are provided N reflectors corresponding to the N respective input IDTs.

7. A SAW filter according to claim 1, wherein the reflectors comprise gratings.

8. A SAW filter according to claim 1, wherein the effective electro-acoustic lengths of respective tracks are selected such that signals from respective tracks undergoing less than a total of N−1 reflections are mutually cancelled.

9. A SAW filter according to claim 1, wherein effective electro-acoustic lengths of respective tracks have phase differences relative to a reference track corresponding to $$\frac{2\pi r}{N}$$

where r corresponds to a sequential integer number of each track relative to the reference track corresponding to an arbitrary displacement in the electro-acoustic lengths.

10. A SAW filter according to claim 1, wherein the input and output IDTs comprise single electrode IDT.

11. A SAW filter according to claim 1, wherein the different effective electro-acoustic lengths are substantially provided by respective tracks having different physical separation between the input and output IDT.

12. A SAW filter according to claim 1, wherein different effective electro-acoustic lengths are substantially provided by different amounts of material disposed in respective tracks between the input and output IDT.

13. A SAW filter according to claim 1, wherein the different effective electro-acoustic lengths are substantially provided by electrical phase shifting networks.

14. A SAW filter according to claim 1, wherein the input and output IDTs each have more than one electrode per period.

15. A SAW filter according to claim 14, wherein the different electro-acoustic lengths are substantially provided by electrodes in corresponding periods of IDTs in respective tracks having different dispositions relative to each other.

16. A SAW filter comprising a group of N tracks, where N is an integer greater than or equal to two, including an input interdigitated transducer (IDT) spaced apart from an output IDT and a reflector disposed substantially collinear with and adjacent the input and output IDTs, wherein respective tracks are selected to have different effective electro-acoustic lengths such that surface acoustic raves launched into respective tracks from the input IDT undergo at least one reflection at a reflector corresponding to the output IDT prior to forming a substantially coherent signal at the output IDT, wherein the input IDT comprises N respective input IDTs electrically coupled together and corresponding to said respective tracks, and wherein electrode connections of at least one of the respective input or respective output IDTs are reversed with respect to the polarity of electrode connections of the IDTs of other tracks.

17. A SAW filter according to claim 16, wherein respective output IDTs and respective input IDTs are electrically coupled in series.

18. A SAW filter comprising a group of N tracks, where N is an integer greater than or equal to two, including an input interdigitated transducer (IDT) space apart from an output IDT and a reflector disposed substantially collinear with and adjacent the input and output IDTs, wherein respective tracks are selectable to have different effective electro-acoustic lengths such that surface acoustic waves launched into respective tracks from the input IDT undergo at least one reflection at a reflector corresponding to the output IDT prior to forming a substantially coherent signal at the output IDT, wherein the input IDTs are symmetrically disposed relative to the output IDTs about a center of the tracks, wherein the IDTs in a second one of the tracks are offset $\alpha$ inwards relative to the IDTs of a first one of the tracks where $\alpha$ is an acoustic wavelength of $j/2N$ for $j=1,2, \ldots 2N-1$, and wherein the reflector of the second track is displaced $\beta/2$ outward from the center of the tracks relative to the reflector of the first track where $\beta$ is an acoustic wavelength of $i/N$ for $i=1,2 \ldots 2N-1$.

19. A SAW filter comprising a group of N tracks, where N is an integer greater than or equal to two, including an input interdigitated transducer (IDT) spaced apart from an output IDT and a reflector disposed substantially collinear with and adjacent the input and output IDTs, wherein respective tracks are selectable to have different effective electro-acoustic lengths such that surface acoustic waves launched into respective tracks from the input IDT undergo at least one reflection at a reflector corresponding to the output IDT prior to forming a substantially coherent signal at the output IDT, wherein N is an even number, wherein the input IDTs are asymmetrically disposed relative to output IDTs with a first set of the IDTs in different tracks being in line, wherein a second set of IDTs and corresponding reflectors opposite the first set are displaced relative to each other from track to track by $\alpha$ and $\beta/2$ respectively, wherein $\alpha$ is an acoustic wavelengths of $2\pi r/N$ with r an odd multiple of N/2 and $\beta/2$ is an acoustic wavelength of $2\pi s/N$ with s an integer that is not a multiple of N, and wherein spacing in at least one of the tracks complies with the following equations:

$$-2*TGG+2*TTGL+\tfrac{1}{4}=M$$

$$TTGR=L/2+\tfrac{1}{8}$$

where M and L are arbitrary integers, TGG is the distance between the reflectors for that track, TTGL is the distance between a left one of the IDTs and a left one of the reflectors for that track, and TTGR is the distance between a right one of the IDTs and a right one of the reflectors for that track.

20. A SAW filter comprising a group of N tracks, where N is an integer greater than or equal to two, including an input interdigitated transducer (IDT) spaced apart from an output IDT and a reflector disposed substantially collinear with and adjacent the input and output IDTs, wherein respective tracks are selectable to have different effective electro-acoustic lengths such that surface acoustic waves launched into respective tracks from the input IDT undergo at least one reflection at a reflector corresponding to the output IDT prior to forming a substantially coherent signal at the output IDT, wherein N is an odd number, wherein one of the IDTs and its corresponding reflector in one of the tracks are respectively offset from one of the IDTs and its corresponding reflector in another track by $\alpha$ and $\beta/2$, where $\alpha$ is an acoustic wavelength of $2\pi r/N$ and $\beta/2$ is an acoustic wavelength of $2\pi s/N$ with s as an integer which is not a multiple of N, and r can be obtained from the equation:

$$-r+s(N-1)/2=K*N$$

where K is any integer, and wherein spacing in at least one of the tracks complies with the following equations:

$$2*TTGL-\tfrac{1}{4}=M$$

$$TTGR=L/2+\tfrac{1}{8}$$

where M and L are arbitrary integers, TTGL is the distance between a left one of the IDTs and a left one of the reflectors for that track, and TTGR is the distance between a right one of the IDTs and a right one of the reflectors for that track.

* * * * *